(12) United States Patent
Lin et al.

(10) Patent No.: US 7,632,128 B2
(45) Date of Patent: Dec. 15, 2009

(54) ELECTRICAL CONNECTOR ASSEMBLY WITH FASTENING ELEMENT

(75) Inventors: Nan-Hung Lin, Tu-cheng (TW); Chih-Pi Cheng, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/286,698

(22) Filed: Sep. 30, 2008

(65) Prior Publication Data

US 2009/0093142 A1    Apr. 9, 2009

(30) Foreign Application Priority Data

Oct. 9, 2007    (CN) .................... 2007 2 0043543 U

(51) Int. Cl.
   *H01R 13/62* (2006.01)
(52) U.S. Cl. ...................................... 439/331; 439/487
(58) Field of Classification Search ................. 439/331, 439/73, 66, 487; 361/719, 704
   See application file for complete search history.

(56) References Cited

U.S. PATENT DOCUMENTS

2002/0081869 A1* 6/2002 Abbott ........................ 439/66
2003/0036301 A1* 2/2003 Colbert et al. .............. 439/331
2007/0149025 A1* 6/2007 Mori et al. .................. 439/331
2007/0264849 A1* 11/2007 Steckler et al. ............... 439/82

* cited by examiner

*Primary Examiner*—Hien Vu
(74) *Attorney, Agent, or Firm*—Andrew C. Cheng; Wei Te Chung; Ming Chieh Chang

(57) ABSTRACT

An electrical connector assembly, for electrically interconnecting an IC package with a printed circuit board, includes a printed circuit board, an electrical connector mounted on the printed circuit board, an IC package mounted in the electrical connector, a heat sink seated on the electrical connector, a backboard located under the printed circuit board and a plurality of first and second elements. The electrical includes an insulative base and a load plate mounted on the insulative base, and the load plate defines a plurality of first holes. The heat sink defines a plurality of second holes, while the printed circuit board defines a plurality of third holes, and the backboard defines a plurality of fourth holes. The first elements are inserted through the first, the third and the fourth holes to fasten the IC package, the electrical connector, the printed circuit board and the backboard together. The second elements fasten the heat sink with the electrical together through the second holes by engaging with the first elements. Accordingly, a reason can be found out easily when the IC package can't work normally.

8 Claims, 4 Drawing Sheets

ELECTRICAL CONNECTOR ASSEMBLY WITH FASTENING ELEMENT

BACKGROUND OF THE INVENTION

1. Field of the Invention

The present invention relates to the art of electrical connectors, and more particularly to arrangements of fastening elements of an electrical connector assembly.

2. Description of the Related Art

A conventional LGA (Land Grid Array) electrical connector assembly 100' is shown in FIG. 4. The electrical connector assembly 100' comprises an electrical connector 2' defining a top mating surface 21' and an opposite mounting surface 22', an IC package 4' mounted onto the mating surface 21' of the electrical connector 2' and defining a top surface 41' in a center thereof, a heat sink 1' mounted onto the top surface 41' of the IC package 4', and a printed circuit board 3' mounted onto the mounting surface 22' of the electrical connector 2'. Normally the printed circuit board 3' defines a first set of through holes 31', while the heat sink 1' defines a second set of through holes 10' in vertical alignment with the corresponding first set of holes 31', respectively. Fastening devices, such as bolts 5', are inserted through the second set of through holes 10' of the heat sink 1', a plurality of springs 6' located between the heat sink 1' and the printed circuit board 3', and the first set of through holes 30' of the printed circuit board 3' in turn in order to hold the heat sink 1', the IC package 4', the electrical connector 2' and the printed circuit board 3' together. Finally, the electrical connector 2' electrically connects the IC package 4' to the printed circuit board 3', and the heat sink 1' presses intimately against the top surface 41' of the IC package 4' for cooling the IC package 4' normally.

However, as the heat sink 1', the IC package 4', the electrical connector 2' and the printed circuit board 3' are fastened together by the bolts 5' directly, when the IC package 4' works in an abnormal state, it is difficult to distinguish which part, the heat sink 1' or the electrical connector 2' is responsible for after detaching blots 5'.

In view of the above, it is strongly desired to provide an improved electrical connector assembly to overcome the above-mentioned disadvantage.

SUMMARY OF THE INVENTION

Accordingly an object of the present invention is to provide an electrical connector assembly, which has two set of fastening elements.

To fulfill the above-mentioned object, an electrical connector assembly comprises an electrical connector, a heat sink, a printed circuit board, and a fastening device. The electrical connector includes an insulative base defining a mating surface, an opposite mounting surface and a plurality passageways running through the mating surface and the mounting surface, a plurality of terminals received in the passageways of the insulative base, and a load plate mounted upon the insulative base and having an opening in a center thereof and a plurality of first holes thereon. The heat sink is mounted upon the load plate of the electrical connector, and defining a plurality of second holes. The printed circuit board faces the mounting surface of the insulative base of the electrical connector and defines a third plurality of holes aligned with the first holes. The fastening device includes a plurality of first elements inserting into the first holes of the load plate of the electrical connector and the third holes of the printed circuit board to hold the electrical connector and the printed circuit board together, and a plurality of second elements inserting into the second plurality of holes of the heat sink for fastening the heat sink upon the electrical connector. Accordingly, the electrical connector assembly is fastened together by the first set of fastening elements and the second set of fastening elements, respectively. When the IC package is not in normal working state, an assured reason will be found out quickly.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
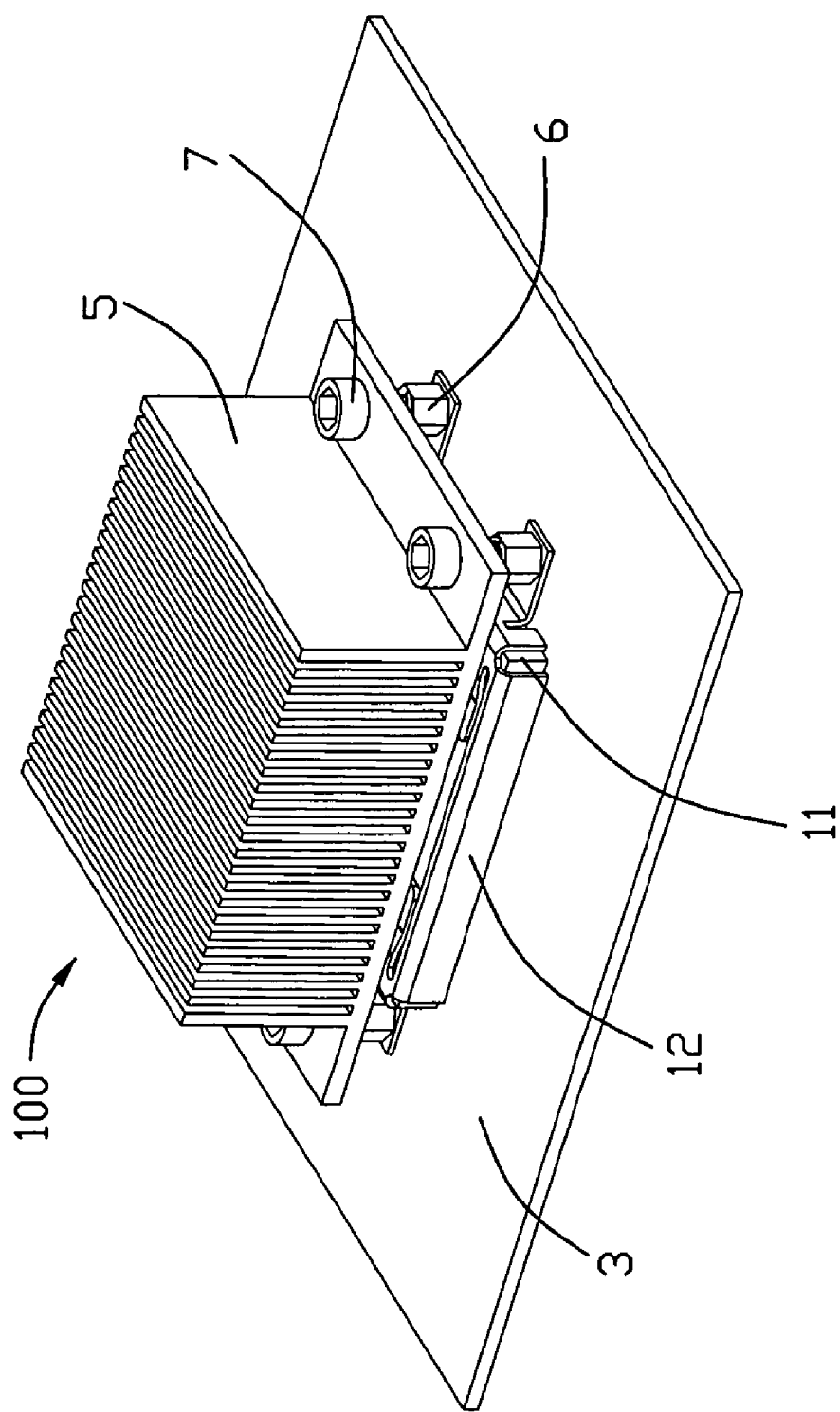
FIG. 1 is an assembled, perspective view of an electrical connector assembly according to an embodiment of the present invention.
Figure 2:
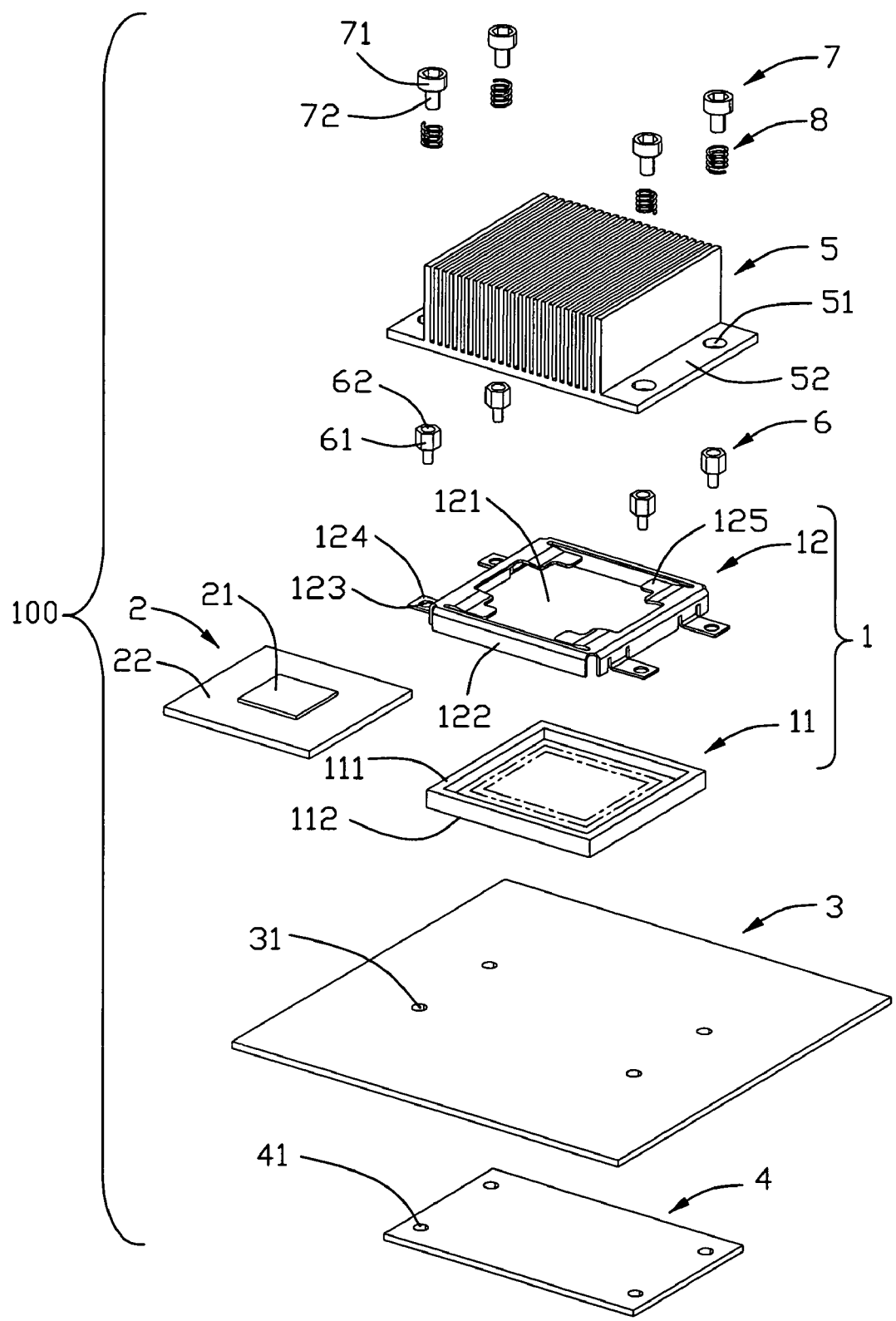
FIG. 2 is an exploded, perspective view of the electrical connector assembly of FIG. 1.
Figure 3:
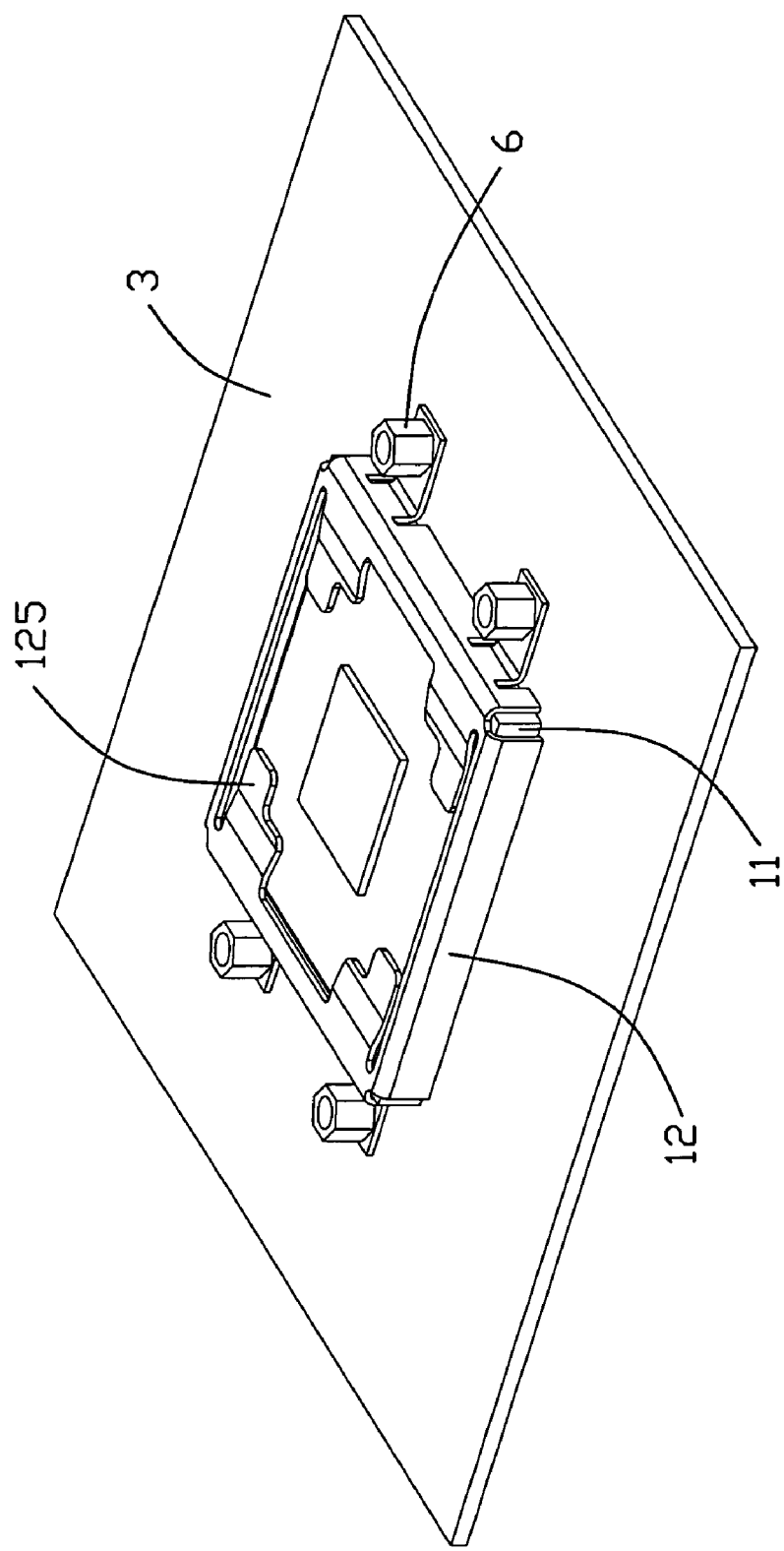
FIG. 3 is an assembled, perspective view of the electrical connector without a heat sink.
Figure 4:
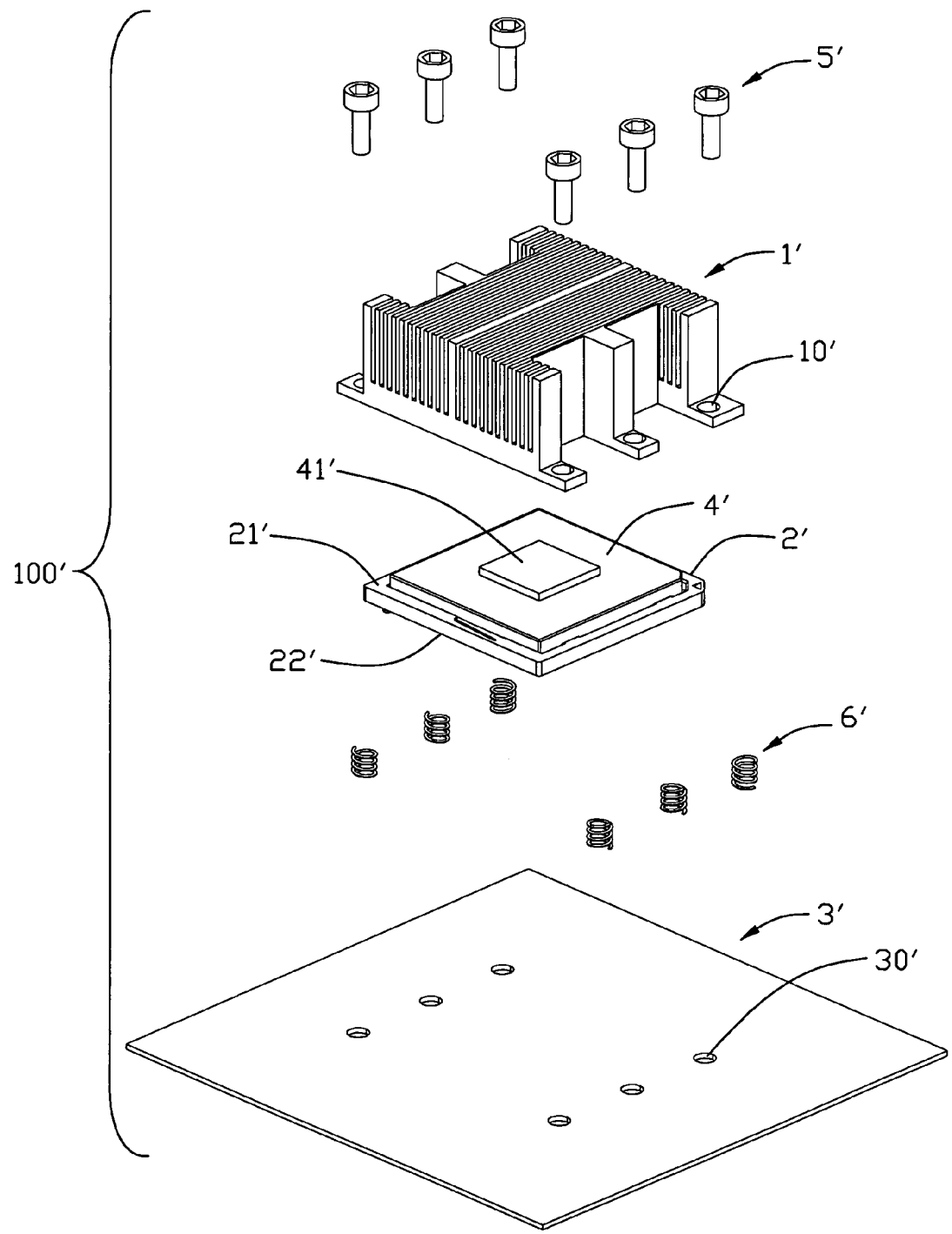
FIG. 4 is an exploded, perspective view of a conventional electrical connector assembly.

Referring to FIGS. 1 to 3, an electrical connector assembly 100 according to an embodiment of the present invention is shown. The electrical connector assembly 100 includes an electrical connector 1, an IC package 2, a printed circuit board 3, a backboard 4, a heat sink member 5, and fastening devices. The electrical connector 1 mounted upon the printed circuit board 3, and the backboard 4 is located under the printed circuit board 3 opposite to the electrical connector 1. The IC package 2 is housed in the electrical connector 1, and has a protruding portion 21 in a center thereof. The heat sink 5 is mounted upon the electrical connector 1 and presses against the protruding portion 21 of the IC package 2.

As shown in FIG. 2, the electrical connector 1 includes an insulative base 1, a plurality of terminals (not shown) received in the insulative base 11 and a load plate 12 mounted upon the insulative base 11. The insulative base 11 is generally configured to a rectangular shape and defines a mating surface 111, an opposite mounting surface 112 and a plurality passageways (not shown) running through the mating surface 111 and the mounting surface 112. The terminals (not shown) are received in the passageways (not shown) of the insulative base 11. The load plate 12 is mounted upon the insulative base 11, and defines an opening 121 in a center thereof, four peripheral sidewalls 122 surrounding the insulative base 11, and four foot portions 123 extending outwardly and substantially parallel to the printed circuit board 3 from bottom ends of two opposite sidewalls 122. Each foot portion 123 disposes a first hole 124 in a center thereof for receiving pin-like fastening elements. The load plate 12 also defines two pressing portions 125 extending into the opening 121 from top ends of said two opposite sidewalls 122, respectively. When the IC package 2 is located between the insulative base 11 and the load plate 12, the pressing portions 125 resist against an upper surface 22 of the IC package 12 for retaining the IC package 2.

The heat sink 5 defines four second holes 51 in two opposite lateral sides 52 thereof in vertical alignment with the corresponding first holes 124 of the load plate 12. At the same time, the printed circuit board 3 also defines four third holes 31 in vertical alignment with the corresponding first holes 124 of the load plate 12, while the backboard 4 defines four fourth holes 41 in vertical alignment with the corresponding third holes 31 and first holes 124.

The fasten devices include a first set of four pin-like first elements 6 and a second set of four second pin-like elements 7. The first pin-like element 6 defines a head portion 61 downwardly seated upon and pressing against the foot portion 123 of the load plate 12 of the electrical connector 1, and a vertical screw hole 62 in the head portion 123 for receiving the second pin-like element 7. The second pin-like element 7 is directly fastened with the first pin-like element 6, and has a head 71 for pressing against the lateral side 52 of the heat sink 5 and a pin portion 72 for being partially screwed into the screw hole 62 of the first pin-like element 6. The electrical connector assembly 100 further includes four springs 8 ringing the pin portions 72 of the second pin-like elements 7, and two opposite ends of each spring 8 resists against a bottom surface of the heat sink and the head portion 61 of the first pin-like element 6, respectively.

Now turning to FIGS. 1 and 3, in assembly of the electrical connector assembly 100, the insulative base 11 of the electrical connector 1 is firstly mounted upon the printed circuit board 3, and then the IC package 2 is installed on the mating surface 111 of the insulative base 11 and located between the insulative base 11 and the load plate 12. Then, the first set of pin-like elements 6 are inserted through the first holes 124 of the load plate 12, the third holes 31 of the printed circuit board 3, and the fourth holes 41 of the backboard 4 in turn in order to fasten the IC package 2, the electrical connector 1, the printed circuit board 3, and the backboard 4 together. At last, the heat sink 5 is mounted upon the load plate 12 of the electrical connector 1 and presses intimately on the protruding portion 21 of the IC package 21. As shown in FIG. 1, the second set of pin-like elements 7 are inserted through the second holes 52 of the heat sink 5 and the springs 8, and have the pin portion 72 partially screwed in the screw holes 62 of the head portions 61 of the first set of pin-like elements 6 in order to fasten the heat sink 5 and the electrical connector 1 together. Accordingly, compared to the prior art, when the IC package 21 is not in normal working state, an assured reason will be found out more quickly by detaching the first elements 6 or the second elements 7 of the fasten device, separately. Furthermore, because the pressing portions 125 of the load plate 12 press the top surface 22 of the IC package 2 all around, stable and reliable electrical connection between the IC package 2 and the printed circuit board 3 is attained, and a risk of warp of the IC package 2 is decreased.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. An electrical connector assembly comprising:
    an electrical connector including:
        an insulative base defining a mating surface, an opposite mounting surface and a plurality passageways running through the mating surface and the mounting surface;
        a plurality of terminals received in the passageways of the insulative base; and
        a metallic load plate mounted upon the insulative base and having an opening in a center thereof and a plurality of first holes thereon;
    a heat sink mounted upon the load plate of the electrical connector, and defining a plurality of second holes;
    a printed circuit board facing the mounting surface of the insulative base of the electrical connector, and defining a third plurality of holes aligned with the first holes;
    a fastening device, including:
        a plurality of first elements inserting into the first holes of the load plate of the electrical connector and the third holes of the printed circuit board to hold the electrical connector and the printed circuit board together; and
        a plurality of second elements inserting into the second plurality of holes of the heat sink for fastening the heat sink upon the metallic load plate;
        wherein said load plate of the electrical connector defines a plurality of peripheral sidewalls surrounding said insulative base, and a plurality of foot portions extending outwardly from bottom ends of the sidewalls, and said first holes are disposed on the foot portions;
    wherein said load plate of the electrical connector defines a plurality of pressing portions extending into the opening thereof from top ends of the sidewalls adapted for resisting against an up surface of an IC package;
    wherein said second holes of the heat sink aligning with the first holes of the electrical connector, and the second elements are directly fastened to the first elements; and
    wherein the electrical connector assembly further comprising a backboard mounted under the printed circuit board opposite to the electrical connector, and the backboard further defines a plurality of fourth holes in alignment with corresponding third holes of the printed circuit board for the first elements penetrating therethrough.

2. The electrical connector assembly as claimed in claim 1, wherein each of the first elements has a head portion downwardly seated upon and pressing against the foot portion of the electrical connector, and each of the second elements runs through the second hole of the heat sink and has a pin portion thereof partially received in the head portion of the first element.

3. The electrical connector assembly as claimed in claim 2, further comprising a plurality of spring elements ringing the pin portions of the second elements, and two opposite ends of the spring elements resists against a bottom surface of the heat sink and the head portion of the first element, respectively.

4. An electrical connector assembly comprising:
    a printed circuit board;
    an electrical connector mounted upon the printed circuit board, including:
        an insulative base defining a mating surface, an opposite mounting surface and a plurality passageways running through the mating surface and the mounting surface;
        a plurality of terminals received in the passageways of the insulative base;
        a metallic load plate mounted upon the insulative base and having an opening in a center thereof;
    an IC package seated between the insulative base and the load plate of the electrical connector, the IC package projecting outside from the opening of the load plate and intimately contacting the terminals of the electrical connector;
    a heat sink mounted upon the load plate of the electrical connector;
    a plurality of first fastening elements located within the load plate of the electrical connector and having a head downwardly seated upon and pressing against the load plate to fasten the electrical connector and the printed circuit board together; and a plurality of second fastening elements located within and fastening the heat sink upon the metallic load plate;
wherein said second set of fastening elements are directly fastened to the first set of fastening elements, respectively;

wherein said load plate of the electrical connector defines a plurality of peripheral sidewalls surrounding said insulative base, and a plurality of foot portions extending outwardly from bottom ends of the sidewalls, and the foot portions define a plurality of first through holes;

wherein said load plate of the electrical connector defines a plurality of pressing portions extending into the opening from top ends of the sidewalls adapted for resisting against an upper surface of the IC package;

wherein said heat sink defines a plurality of second through holes in vertical alignment with the corresponding first through holes;

wherein said printed circuit board defines a plurality of third through holes in vertical alignment with the corresponding first through holes and the second through holes;

wherein the electrical connector assembly further comprising a backboard mounted under the printed circuit board opposite to the electrical connector, and the backboard further defines a plurality of fourth through holes in vertical alignment with corresponding third holes of the printed circuit board.

5. The electrical connector assembly as claimed in claim 4, wherein said first fastening elements and the second fastening elements are vertically aligned with each other, respectively.

6. The electrical connector assembly as claimed in claim 5, wherein said first fastening elements fasten the electrical connector, the printed circuit board and the backboard together by passing through the first, the third, and the fourth holes in turn, while said second fastening elements fasten the heat sink and the electrical connector together through the second holes of the heat sink by a part of the second fastening element screwing with corresponding first fastening element.

7. An electrical connector assembly comprising:
a printed circuit board defining a plurality of first through holes therein;
an insulative housing mounted upon the printed circuit board;
an electronic package seated upon the housing;
a metallic load plate surrounding the housing and positioned upon the electronic package to pressing downward the electronic package against the housing, said load plate further defining a plurality of second through holes therein;
a heat sink seated upon the load plate and thermally engaging the electronic package, and further defining a plurality of third through holes therein;
a plurality of first screws extending through the corresponding second and first through holes respectively to fasten the load plate to the printed circuit board, and
a plurality of second screws extending through the third through holes and fastening to the corresponding first screws, respectively, for holding the heat sink in position;
wherein said load plate of the electrical connector defines a plurality of peripheral sidewalls surrounding said insulative housing, and a plurality of foot portions extending outwardly from bottom ends of the sidewalls, and the foot portions define a plurality of first through holes;
wherein said load plate of the electrical connector defines a plurality of pressing portions extending into the opening from top ends of the sidewalls adapted for resisting against an upper surface of the IC package;
wherein a back plate is positioned on an underside of the printed circuit board under a condition that the first screws extend through the printed circuit board and said back plate for securing.

8. The electrical connector assembly as claimed in claim 7, wherein a spring is located between the first screw and an underside of the heat sink in a tensioned manner.

* * * * *